United States Patent [19]

Yamamura et al.

[11] 4,223,264
[45] Sep. 16, 1980

[54] RADIO WAVE POWER MEASURING APPARATUS

[75] Inventors: Kyohei Yamamura; Takemi Inoue, both of Higashimurayama; Toshio Nemoto, Tokyo; Hidetoshi Miyao, Atsugi; Yukihiro Tsumura, Zama; Hiromichi Toda, Atsugi; Itsuo Sugiura, Machida, all of Japan

[73] Assignees: Director-General of the Agency of Industrial Science and Technology; Anritsudenki Kabushikigaisha, both of Japan

[21] Appl. No.: 968,816

[22] Filed: Dec. 12, 1978

[30] Foreign Application Priority Data

Dec. 15, 1977 [JP] Japan .................................. 52/149918

[51] Int. Cl.² ........................ G01R 21/04; G01R 5/22
[52] U.S. Cl. ................................ 324/95; 73/190 EW; 324/106
[58] Field of Search ............... 324/95, 106; 73/193 R, 73/355, 190 EW; 250/352

[56] References Cited

U.S. PATENT DOCUMENTS

| | | | |
|---|---|---|---|
| 2,398,606 | 4/1946 | Wang | 324/95 |
| 2,451,724 | 10/1948 | Evans | 324/95 |

*Primary Examiner*—Ernest F. Karlsen
*Attorney, Agent, or Firm*—Staas & Halsey

[57] ABSTRACT

A radio wave power measuring apparatus is disclosed, which includes a thermal load confined in a reference temperature housing, a wave absorber disposed in the load for absorbing radio waves supplied thereto, a heater for heating the load, a thermoelectric cooler element provided between the housing and the load for the load, a temperature difference detector having a thermoelectric sensor element provided between the housing and the load for detecting the difference in temperature between the housing and the load, a heater controller for feeding to the heater the power corresponding to the temperature difference detected by the detector so as to maintain the load and the housing at the same temperature, and a measuring member for measuring the power fed to the heater.

20 Claims, 19 Drawing Figures

RADIO WAVE POWER MEASURING APPARATUS

BACKGROUND OF THE INVENTION

This invention relates generally to a power measuring apparatus, and more particularly to a calorimeter type apparatus for measuring radio wave power of a millimeter-wave or the like.

Heretofore, for the measurement of millimeter-wave power in the range of several microwatts to a hundred milliwatts, a system called bolometer measurement is frequently employed, as in the case of a microwave band, in which a bridge and a bolometer mount are used in combination and a thermistor or barretter is used as a power absorbing element. In the millimeter-wave power measurement, however, extreme deterioration is unavoidable in the substitution efficiency of the bolometer mount due to a remarkably high rate of a thermal loss caused principally by the wall of a waveguide. For this reason, the power obtained through substitutional measurement by the bolometer mount becomes considerably different from the true power, and this brings about the necessity of calibrating the substitution efficiency of the bolometer mount by some proper means to ensure precision measurement of millimeter-wave power.

Presently, in measurement of a small-value power of a millimeter-wave band, the highest accuracy is achievable by the use of a calorimeter. Among the apparatus developed for this purpose, a microcalorimeter is available for measuring the effective efficiency of the bolometer mount. Here, the term "effective efficiency" is defined as a substitution efficiency representing the ratio of the power measured by the bolometer to the true power absorbed by the bolometer mount. The principle of this system is illustrated in FIG. 1.

FIG. 1 is a diagram showing the operating principle of a conventional microcalorimeter for the measurement of a millimeter-wave power, in which a bolometer mount 1 is used as a common thermal load for a millimeter-wave power and a DC power for substitutional measurement. A thermoelectric detector element 5 senses a temperature rise occuring in the bolometer mount 1 as a result of absorbing both the DC power fed to a bolometer element 3 from a bolometer bridge 2 and the millimeter-wave power fed from a waveguide 4. Through negative feedback of the output of the element 5 to a thermoelectric cooler element 7 via a cooling current controller 6, the bolometer mount 1 and a reference temperature jacket 8 are controlled isothermally.

Millimeter-wave power is applied under such control to perform substitutional power measurement by the bolometer mount 1 and the bolometer bridge 2, and simultaneously a cooling current is obtained by measuring the voltage across a standard resistor 9 by means of a voltmeter 10. The effective efficiency of the bolometer mount 1 can be determined from the results of such two measurements. The bolometer mount 1 with the thus determined effective efficiency may be used as a standard for calibrating the effective efficiency of other bolometer mounts through comparative measurement. This will now be further described in detail. In the conventional measurement system shown in FIG. 1, input power is expressed as follows:

$$P = \alpha(\theta + 273°) I_f - \tfrac{1}{2} r I_f^2 + (\theta - \theta_j) g + C \, d\theta/dt \quad (1)$$

where
P: input power (W) to thermal load
$I_f$: Peltier cooling current (A)
$\theta$: thermal load temperature (°C.)
$\theta_j$: temperature (°C.) of reference temperature jacket
g: thermal resistance (W/°C.) between thermal load and jacket
$\alpha$: thermoelectric conversion coefficient
r: electricl resistance (Ω) of Peltier element
C: thermal capacity of thermal load Supposing now that the conditions are established as $$\theta = \theta_j = \theta_o \text{ (constant) and}$$

$$\alpha(\theta + 273°) I_f \gg \tfrac{1}{2} r I_f^2$$

then Equation (1) can be written as follows:

$$P = \alpha(\theta_o + 273°) I_f = K I_f \quad (2)$$

Thus, it denotes that the input power to the thermal load can be obtained from the Peltier coefficient K and the cooling current $I_f$. However, since the Peltier coefficient K is a function of the temperature $\theta_j$ of the reference temperature jacket 8, it is necessary to suppress the change of $\theta_j$ within, for example, ±2/10,000° C. to attain high-accuracy measurement.

For the above reasons, the use of an excellent thermostatic oven is essential. This requires a bulky construction of the apparatus, hence inducing disadvantages in practical use including that the preparation time required for stabilizing the entire apparatus is extended to be as long as several hours.

Furthermore, there are difficulties in producing satisfactory bolometer mounts having both superior matching characteristics and substitution efficiency for use in the millimeter-wave band, and this causes a decrease in the power measuring accuracy.

Accordingly, in precision measurement of a millimeter-wave power, there exists possibility of attaining a higher accuracy by absorbing, without using any bolometer mount, the millimeter-wave power into a small matching load easily producible and then executing direct measurement of the power calorimetrically.

In such calorimetric measurement, the object to be measured is a power or a ratio of two compared powers. Accordingly, the highest accuracy is attainable by the method of measuring the true incident power directly from the known substituted power, without measuring the cooling current as in the aforementioned. That is, since the thermoelectric cooler element 7 used in the microcalorimetric measurement is composed of semiconductor, there exist some disadvantages including that an error resulting from non-linearity of the cooling current or drift of the ambient temperature is basically unavoidable and, in addition to complicated control action, a long measuring time is required due to the large time constant as the feedback control is carried out by the thermoelectric cooler element 7 of a great thermal capacity.

SUMMARY OF THE INVENTION

It is, therefore, an object of the present invention to provide a power measuring apparatus, which is devoid of the problems encountered in the conventional apparatuses.

Another object of this invention is to provide a power measuring apparatus capable of measuring a wide frequency range of a millimeter-wave or the like with both an enhanced measuring accuracy and a reduced measuring time.

In accomplishing the foregoing objects, the present invention provides a radio power measuring apparatus including a reference temperature housing; a thermal load having a power absorber matched for absorption of a radio wave power and an auxiliary heater to which a DC power is fed for heating the load; a thermoelectric cooler element for cooling the load; a detector for detecting a temperature difference between the load and the housing, wherein the thermal load, cooler element and detector are confined in the housing; a cooling-power control circuit for feeding a power to the thermoelectric cooler element; an auxiliary-heater controller for executing negative feedback of the power, which corresponds to the temperature difference between the thermal load and the reference temperature housing detected by the temperature difference detector, to the auxiliary heater so as to maintain the thermal load temperature equal to the temperature of the reference temperature housing; and means for measuring the power fed to the auxiliary heater.

BRIEF DESCRIPTION OF THE DRAWINGS

Other objects, features and advantages of this invention will become apparent from the detailed description of the preferred embodiment which follows, when considered in light of the accompanying drawings, in which.

DETAILED DESCRIPTION OF THE PREFERRED EMBODIMENTS OF THE INVENTION

Figure 1:
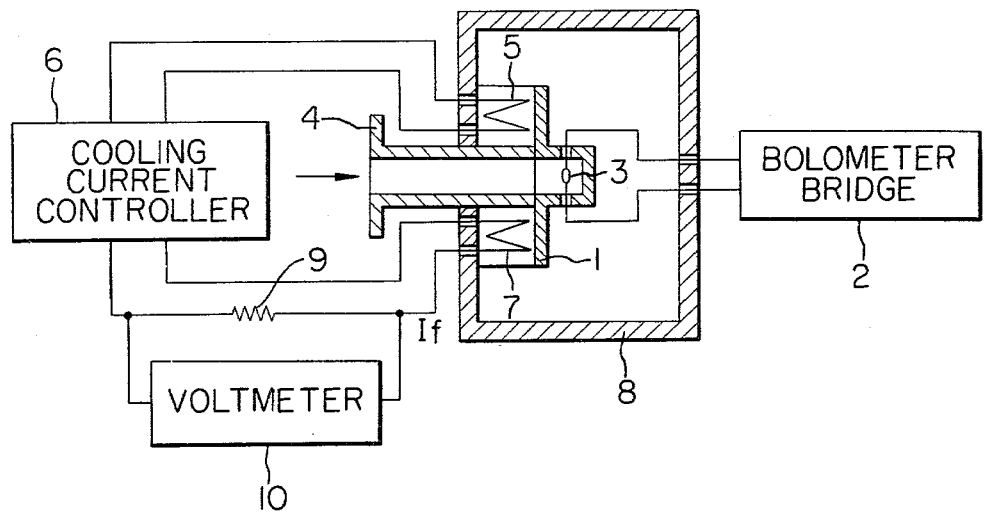
FIG. 1 shows the operating principle of a conventional microcalorimeter for measuring the effective efficiency of a bolometer mount.
Figure 2:
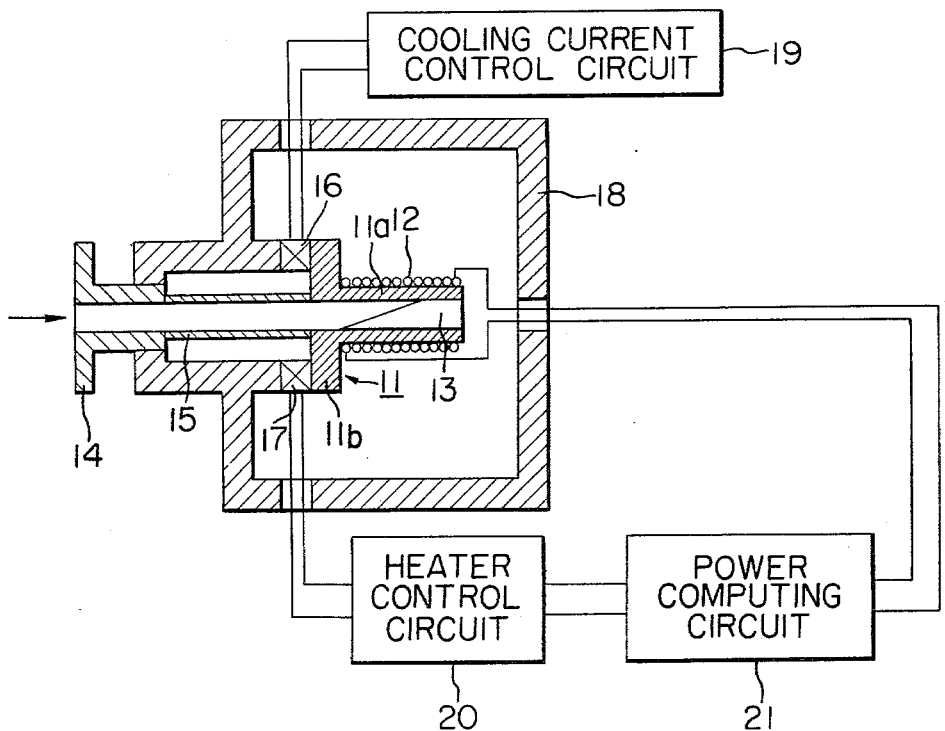
FIG. 2 is a sectional view schematically showing an embodiment of the present invention.

Referring first to FIG. 2, labeled generally as 11 is a metallic thermal load composed of a hollow elongated portion 11a and a flange portion 11b formed radially at one end of the elongated portion. An auxiliary heater 12 is embedded in the wall of the elongated portion 11a for heating the thermal load 11. In the hollow cavity of the load 11 there is disposed a power absorber 13 for absorbing millimeter-waves supplied thereto. Millimeter-waves are introduced from an open ended portion of a waveguide member 14 having a heat insulated waveguide portion 15 to which the thermal load 11 is attached in series. The thermal load 11 and the heat insulated waveguide 15 are confined in a reference temperature housing 18 of a metal of both good thermal conductor and high specific heat such as aluminum, copper and the like. A thermoelectric cooler element 16 and a temperature difference detector 17 using thermoelectric sensor elements are provided between the thermal load 11 and the housing 18 for cooling the thermal load 11 and for detecting the change in temperature therebetween, respectively. A cooling-current control circuit 19 are coupled to the thermoelectric cooler element 16 for controlling a DC power to be fed thereto. Labeled as 20 is an auxiliary-heater control circuit adapted to feed, through negative feedback, a power corresponding to the temperature difference between the thermal load 11 and the reference temperature housing 18 detected by the temperature difference detector 17, to the auxiliary heater 12 so as to maintain the thermal load and the housing 18 at substantially the same temperature. A power computing circuit 21 is provided between the auxiliary-heater control circuit 20 and the heater 12 for measuring an output power supplied to the heater 12.

In the above structure, the measuring operation is performed as follows. First, the cooling power of the thermoelectric cooler element 16 is preset, by manually operating the circuit 19, to a value (e.g. 15 mV) greater tha a foreseen high-frequency power (e.g. 10 mW) to be measured, subsequently the power of the auxiliary heater 12 is controlled, by manually or automatically operating the control circuit 20, to diminish the output of the temperature difference detector 17 to zero, and then the power $P_1$ of the auxiliary heater 12 is computed by the computing circuit 21 in such a state. Next, the high-frequency power to be measured in applied while maintaining the cooling power unchanged, i.e. at 15 mW in this illustrated case, and the manual or automatic control of the circuit 20 is executed again to diminish the output of the temperature difference detector 17 to zero. The power $P_2$ of the auxiliary heater 12 in that state is computed. Thus, the high-frequency power $P_{RF}$ can be obtained from $P_1-P_2=P_{RF}$.

Figure 3:
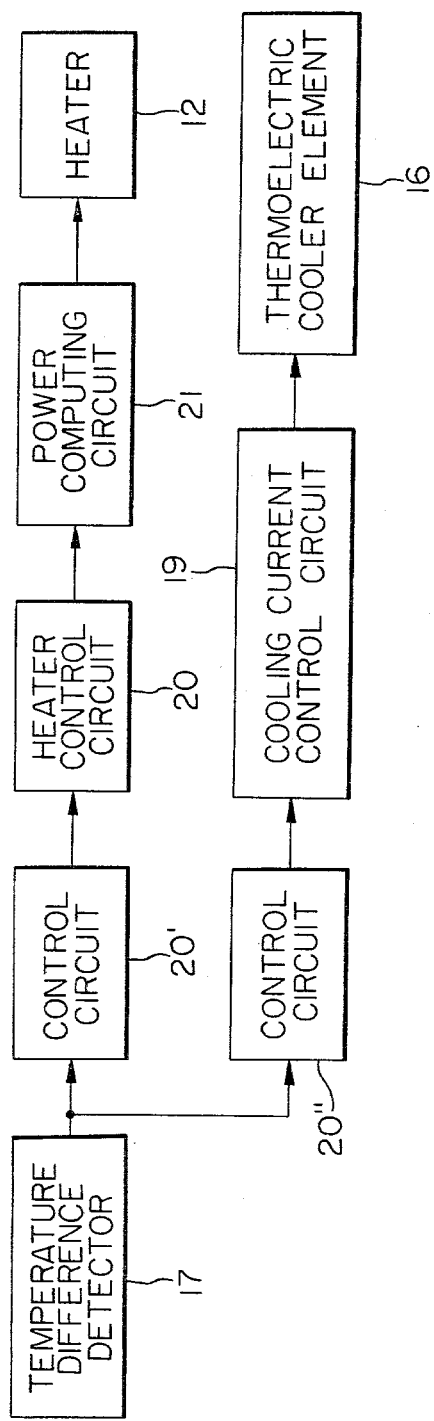
FIG. 3 is a block diagram showing another embodiment of the invention.

The block diagram of FIG. 3 shows an embodiment suited in the case where the power to be measured is not foreseen. The apparatus of FIG. 3 is equipped with a control circuit 20' for presuming the high-frequency power and controlling the auxiliary heater control circuit 20, and also with a control circuit 20" for setting the cooling power and controlling the cooling-power control circuit 19.

First, the high-frequency power $P_{RF}$ to be measured is fed in the state where neither the cooling current nor the auxiliary heater power is fed. Then the thermal load absorbs the high-frequency power $P_{RF}$ to raise its temperature. In this case, it is possible to find an approximate value of the high-frequency power $P_{RF}$ in accordance with the output of the temperature difference detector 17 by measuring the temperature rising rate (e.g. A °C./sec) or the output variation of the detector 17. The relation between the temperature rising rate and the high-frequency power $P_{RF}$ can be grasped previously in the form of relationship between the auxiliary heater power and the temperature rise.

In the next step, cooling power is set to a value greater than and proximate to the presumed high-frequency power $P_{RF}$ manually or automatically, and after energizing the auxiliary-heater control circuit under such conditions, the auxiliary heater power is controlled by manual or automatic means to diminish the output of the temperature difference detector 17 to zero, and then the power $P_1$ of the auxiliary heater 12 at the time is computed. After removal of the high-frequency power, the power of the auxiliary heater 12 is controlled with the cooling power remaining unchanged, by the manual or automatic means in the manner that the output of the temperature difference detector 17 becomes zero. From the auxiliary heater power $P_2$ in this state, the high-frequency power $P_{RF}$ can be found as $P_{RF} = P_2 - P_1$.

It is desired in any of the above-described embodiments that the cooling power is settable stepwise (e.g. 0.1, 0.3, 1, 3, 10, 30 and 100 mW) within the entire measuring range of the apparatus. Regarding the power control for the auxiliary heater 12, the circuit can be formed into a single configuration of analog negative feedback type. However, attainment of a sufficiently high negative feedback gain is necessary for minimizing the substitution error and shortening the setting time, hence rendering some technical difficulties unavoidable. In this case, the art of adaptive control is suited as it is possible to obtain a sufficiently great negative feedback gain (compression ratio). Although such art can be executed in a digital mode alone, the residual substitution error is widely reducible with ease by a combination of digital and analog modes, as shown in FIG. 4.

Figure 4:
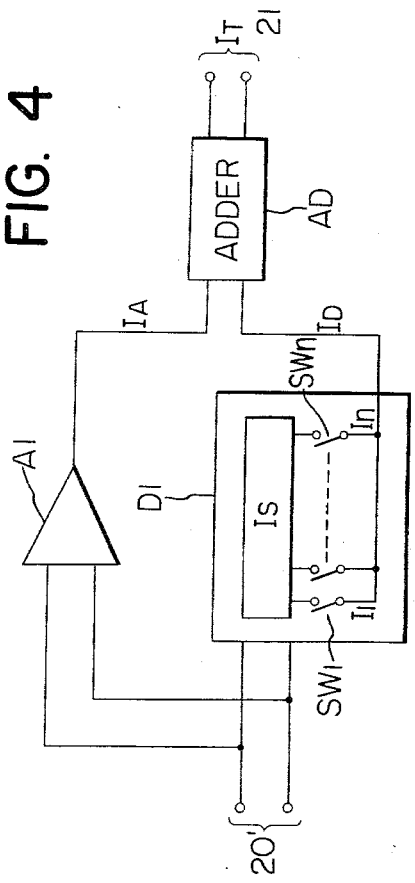
FIG. 4 is a block diagram showing an exemplary system for controlling an auxiliary heater or a thermoelectric cooler element.

FIG. 4 illustrates an example of auxiliary-heater control circuit 20, in which the output $I_T$ of an adder AD is the sum of a fixed stepped current $I_D$ (one of $I_1$–$I_n$), which is settable digitally by switches $SW_1$–$SW_n$ from a current source $I_s$ in a digital current setting circuit DI, and a current $I_A$ changed continuously in accordance with the output of a temperature difference detector 17 in an analog current measuring circuit AI.

The circuit action is so performed that a value proximate to the current corresponding to the input power is set digitally, and the remaining small current component is controlled with increase or decrease of the current $I_A$ changed continuously. For example, if $I_1$ corresponds to 0.01 mW:

$$I_2 = \sqrt{2}\, I_1$$

$$I_3 = \sqrt{2}\, I_2 = 2 I_1$$

$$I_4 = \sqrt{2}\, I_3 = 2\sqrt{2}\, I_1$$

$$\vdots$$

$$I_n = \sqrt{2^{n-1}}\, I_1$$

Figure 5:
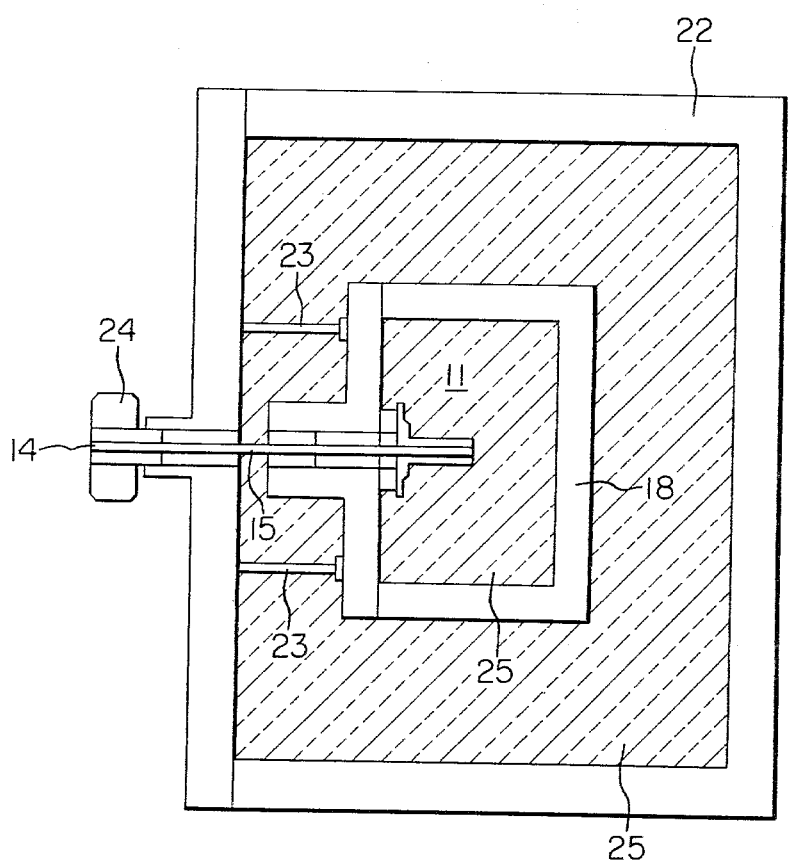
FIG. 5 is a sectional view schematically showing a further embodiment of this invention.
Figure 6A:
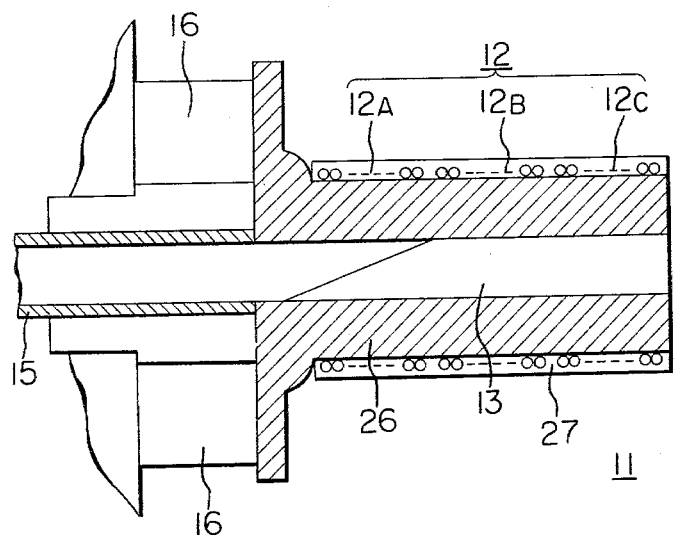
FIGS. 6(a) and (b) are an enlarged sectional front view and a plane view, respectively, of a thermal load in the embodiment of FIG. 5.
Figure 6B:
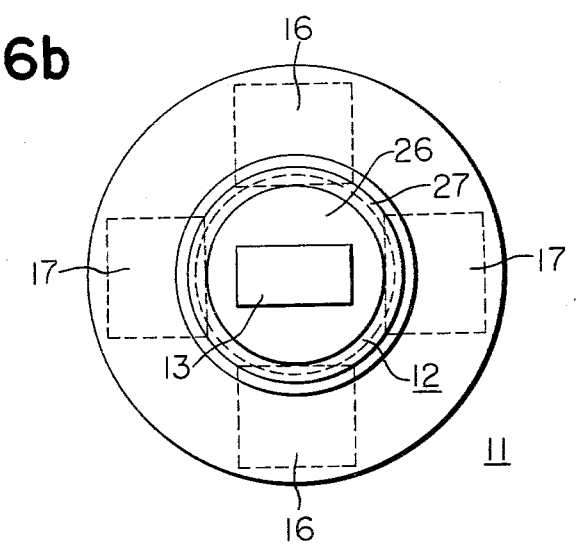

Another embodiment of the present invention shown in FIG. 5 is a thermal balancing microcalorimeter useful for measuring a power in a 150 GHz frequency band. In this embodiment and the following ones to be described hereinafter, the auxiliary-heater control circuit 20 and so forth are omitted in the illustrations. In FIG. 5, a reference temperature housing 18 is surrounded with an outer jacket 22 and is supported by posts 23. Labeled as 24 is an input flange, and 25 is a thermal insulating material such as styrene foam. As illustrated, both the inner space of the housing 18 and the space defined between the housing 18 and the outer jacket 22 are filled with the insulating material. This structure serves well to minimize the harmful influence of ambient temperature fluctuation on the reference temperature housing 18. The incident millimeter-wave power is introduced from the input flange 24 via a waveguide 14 and a heat insulated waveguide 15 to a thermal load 11. The waveguide 15 has an interior surface plated integrally and uniformly with gold by precision electroforming so as to minimize the loss of the millimeter-wave power be reflection and surface resistance. In order to enhance the adiabatic effect, the base of the waveguide 15 is formed of nickel with its wall thickness of about 0.2 millimeters. The details of thermal load 11, thermoelectric cooler element 16 and temperature difference detector 17 are illustrated in FIGS. 6(a) and (b). For the purpose of ensuring uniform temperature distribution, the thermal load 11 is formed of a good thermal conductor such as copper, and its hollow elongated portion 26 has a relatively thick wall. The elongated portion 26 serves as a wave guide, in which a millimeter-wave power absorber 13 is inserted. The absorber 13 can be formed of ferrite and is preferably tapered to improve matching characteristics. In an attempt to avoid discontinuity of a transmission line at the boundary between the thermal insulated waveguide 15 and the thick waveguide 26, the latter waveguide is produced with the same mold as used for the insulated waveguide 15 and they have a unitary interior surface layer of such as gold uniformly formed by electroforming.

The auxiliary heater 12 is so constituted that thin manganese wires (0.06 mm in diameter) of a small resistance-temperature coefficient are coiled to form split windings 12A, 12B and 12C. The coiled windings are applied with a coat of a heat conductive binder 27 so as to be thermally integrated with the thick waveguide 26. By virtue of splitting the auxiliary heater winding 12 in this manner, a feedback power can be applied to each of the split windings individually. And this serves as remarkably effective means for analyzing the error based on the calorific distribution difference.

Between the flange portion of the thermal load 11 and a reference temperature housing 18, four Peltier elements each consisting of p-type and n-type semiconductors are interposed at positions symmetrical with respect to the axis of the waveguide. Out of the four Peltier elements, one pair opposed to each other function as a thermoelectric cooler 16, while the other pair function as a temperature difference detector 17.

In this embodiment, since the power absorber 13 and the split windings 12A–12C of the auxiliary heater 12 are located with positional differences on the inside and outside of the thick waveguide 26, there occurs a slight power substitution error. However, it is possible to decrease such an error by previously providing a DC heater in the thick waveguide 26 and calibrating the substitution ratio to the auxiliary heater 12. This error is minimized as the calorific distribution concerning the auxiliary heater 12 is adjusted to coincide with the calorific distribution concerning the millimeter power absorption. FIGS. 7 through 10 illustrate examples of auxiliary heater 12 accomplished in consideration of the above point.

Figure 7A:
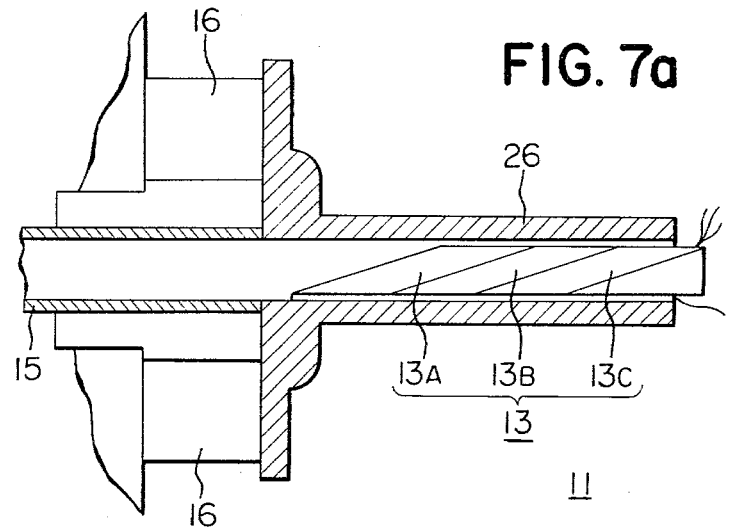
FIGS. 7(a), (b) and (c) are an enlarged sectional front view and a side view of other example of a thermal load, and a plane view showing a power absorber thereof, respectively.
Figure 7B:
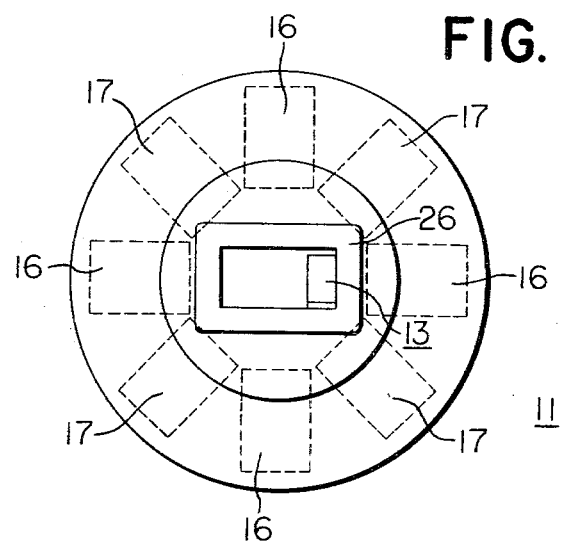
Figure 7C:
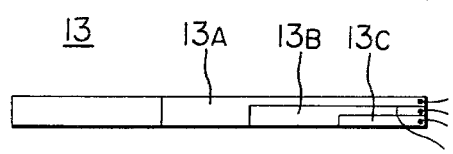

In the example of FIGS. 7(a) and (b), electrical resistance thin films 13A, 13B and 13C are formed by evaporation on the surface of a dielectric member of a good thermal conductor such as beryllium oxide to constitute a power absorber 13, which is attached to the inner wall of a thick waveguide 26. Its plane view is shown in FIG. 7(c). The power absorber 13 is usable as an auxiliary heater with the provision of leadwires extending from the resistance thin films 13A-13C. In this embodiment, each of a thermoelectric cooler 16 and a temperature difference detector 17 consists of four Pelitier elements, which are so disposed as to be symmetrical with respect to the axis of the thick waveguide 26. Although there is no particular restriction on the number of Pelitier elements employed, a symmetrical disposition thereof is preferred for minimizing the measuring error.

Figure 8A:
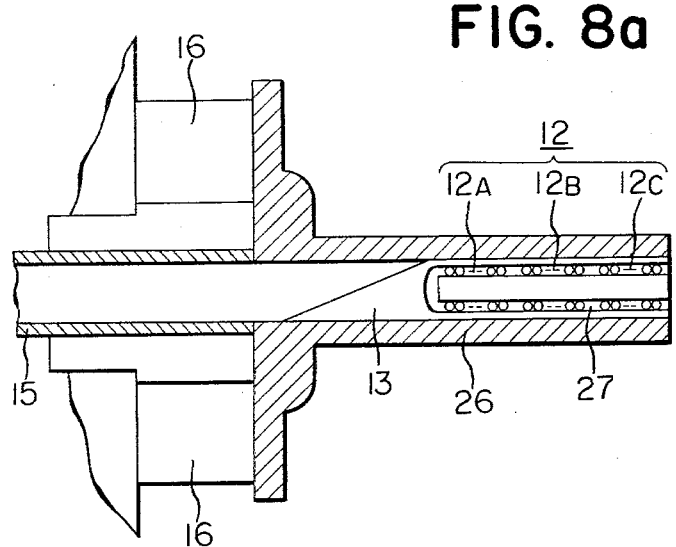
FIGS. 8(a) and (b),
FIGS. 9(a) and (b),
FIGS. 10(a) and (b), and
FIGS. 11(a) and (a') show further examples of a thermal load, in which each diagram (a) is an enlarged sectional front view, and each diagram (b) is a side view.
Figure 8B:
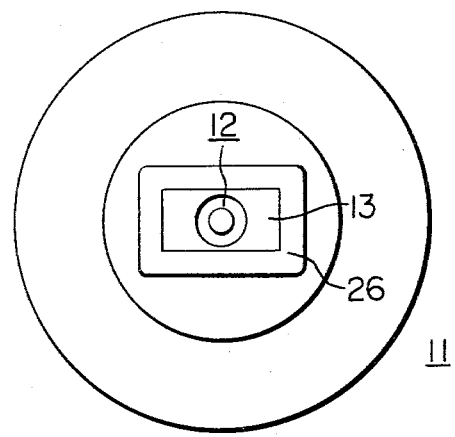

In the example of FIGS. 8(a) and (b), split windings 12A-12C constituting an auxiliary heater 12 are embedded in the center region of a power absorber 13. In this case also, filling the space with a heat conductive binder 27 is effective to attain satisfactory thermal contact between the split windings 12A-12C and the power absorber 13.

Figure 9A:
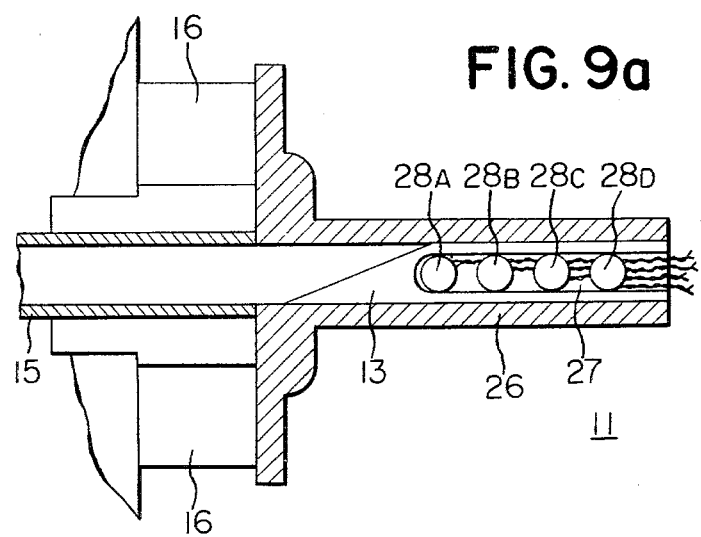
Figure 9B:
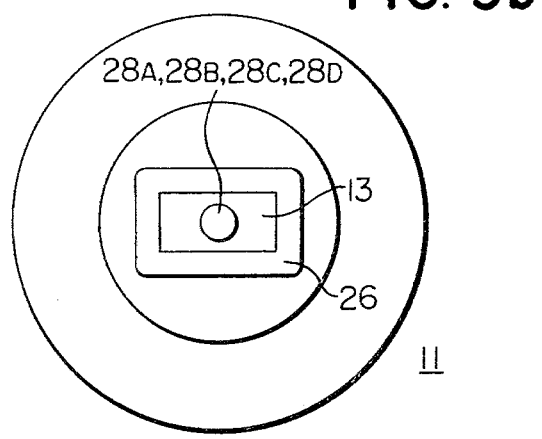

In the next example of FIGS. 9(a) and (b), resistance elements 28A-28D such as bead thermistors are embedded instead of resistance wires to constitute an auxiliary heater 12. The significance of using a plurality of resistance elements resides in that the error resulting from calorific distribution difference can be analyzed as in the case of splitting the auxiliary heater 12 into a plurality of windings 12A-12C.

Figure 10A:
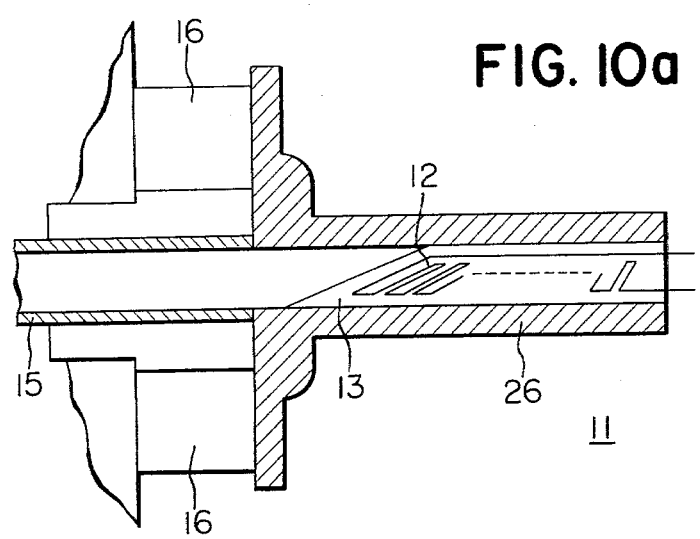
Figure 10B:
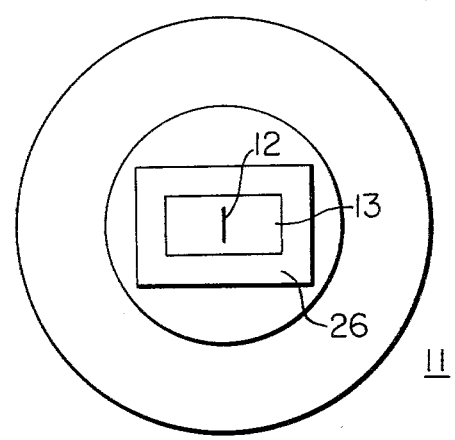

FIG. 10 shows another example employing a molded power absorber 13 with an auxiliary heater 12 sealed therein. In this instance as well, the auxiliary heater 12 may be constituted of split windings disposed at suitable positions so as to utilize the merit of splitting.

Figure 11A:
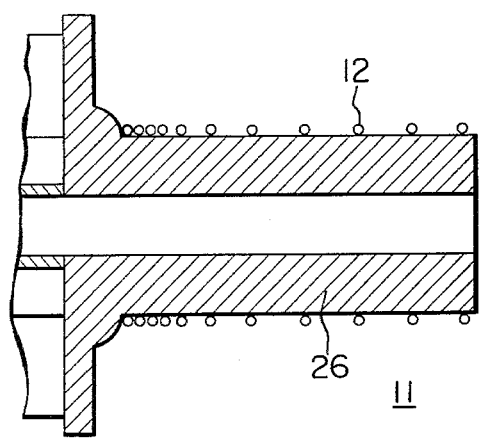
Figure 11A:
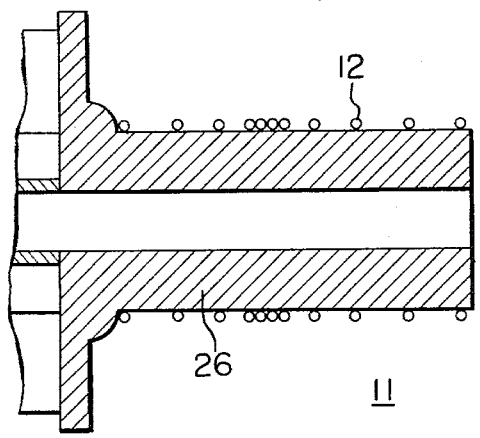

FIGS. 11(a) and (a') show further examples related to the way of winding the wire of an auxiliary heater 12, in which the winding density is changed in the axial direction of a waveguide in a thermal load 11. Thus, since the winding density is partially different, generation of the heat caused by applying a fixed current to the auxiliary heater 12 is distributed in proportion to the density of the auxiliary heater 12, so that the calorific distribution obtained by proper selection of the density distribution can be equalized to minimize the substitution error. Although a single continuous winding of the auxiliary heater 12 also has the same effect as the aforementioned split windings of uniform density, a better result will be obtained in analysis of the thermal distribution if the heater is divided into a plurality of windings.

Figure 12:
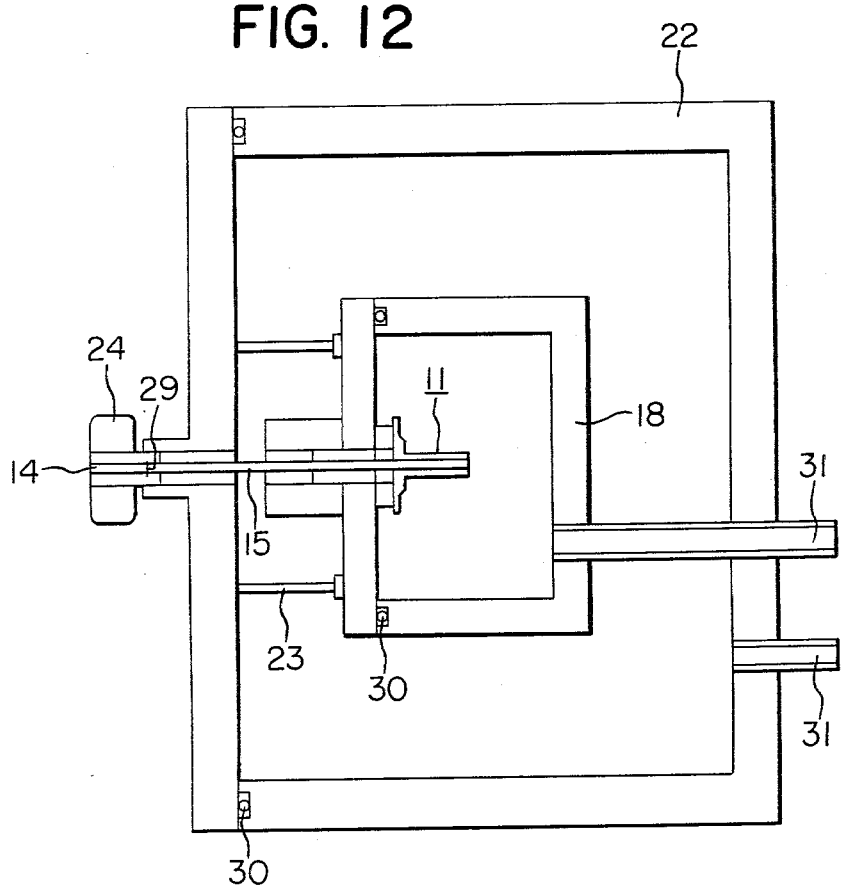
FIG. 12 is a sectional view schematically showing a further embodiment of the invention.

FIG. 12 illustrates another embodiment of the present invention implemented by modifying the foregoing embodiment of FIG. 5 where the inside of the reference temperature housing 18 and also the space between this housing and the outer jacket 22 are filled with the thermal insulating material 25 for the purpose of avoiding the harmful influence of external temperature fluctuation resulting from convection at the peripheries of the thermal load 11 and the adiabatic waveguide 15 and simultaneously for removing the nonlinearity of DC substitution caused by convection. In FIG. 12, the inside of the reference temperature housing 18 and the space between this housing and the outer jacket 22 are kept to be vacuum for ideally eliminating the harmful influence of convection, the instability existing in contact between metallic parts and the thermal insulating material, and also the thermal characteristic variation resulting from secular change of the insulating material. Some additional components are provided for the purpose of ensuring the desired result, including an airtight window 29 in the waveguide 14, a sealing 30 such as rubber packing, and an exhaust port 31. In such a vacuum state, transmission of heat caused by radiation between the thermal load 11 and the reference temperature housing 18 or between the exterior and the housing 18 is sufficiently smaller than that occurring due to conduction through the thermal insulating material. Consequently, the thermal flow becomes stable since it is regarded as a result of conduction merely through stable metallic parts, and the thermal analysis accuracy can be enhanced to raise the theoretical correction accuracy.

Although the embodiments of FIGS. 5 and 12 adopt an adiabatic material and a vacuum structure individually, they may be used in conmbination. For example, the inside of the reference temperature housing 18 is maintained to be vacuum while the space between this housing and the outer jacket 22 is filled with the insulating material 25, or vice versa, or air is used instead of the insulating material 25.

It is to be understood that the foregoing explanation given principally on millimeter-wave band is also applicable to measurement of power of any wavelength other than the millimeter-wave.

As described in detail hereinabove, a remarkably high measuring accuracy is attainable by the present invention due to the feature that the object power is measured in the form of a difference between the powers fed to the auxiliary heater. And temperature control for the thermal load is executed by the auxiliary heater without using the thermoelectric cooler element of a large thermal capacity, so that a fast response is ensured in the measuring system with facilitated control action. Moreover, the present invention eliminates the necessity of a highly efficient wide-range bolometer mount that has not been easily producible heretofore with respect to the millimeter-wave band. And the thermal load employed instead of that in this invention is manufacturable with facility. Furthermore, the auxiliary heater equipped with split windings offers convenience for analysis of the error that results from the calorific distribution difference, and more accurate measurement is rendered possible by the structure where the reference temperature housing is covered with the other jacket.

Thus, according to the present invention, there exists an outstanding advantage that accurate measurement of a millimeter-wave power can be easily performed within a short time.

The invention may be embodied in other specific forms without departing from the spirit or essential characteristics thereof. The present embodiments are therefore to be consider in all respects as illustrative and not restrictive, the scope of the invention being indicated by the appended claims rather than by the foregoing description, and all changes which come within the meaning and range of equivalency of the claims are therefore intended to be embraced therein.

What is claimed is:
1. A thermal balancing microcalorimeter comprising:
 a reference temperature housing;
 a waveguide member having a portion extending through an opening of said housing to the inside space thereof;

a thermal load having a hollow elongated portion connected in series to said extending portion of said waveguide member;

heater means adapted for heating said thermal load;

a wave absorber disposed inside the elongated portion of said thermal load and adapted for absoring a radio wave supplied thereto via said waveguide member;

a thermoelectric cooling element connected at one side to a first portion of said housing and at the other side to a first portion of said thermal load and adapted for cooling said thermal load;

a detector having a thermoelectric sensor element connected at one side to a second portion of said housing and at the other side to a second portion of said thermal load for detecting the temperature difference between said housing and said thermal load;

a cooling-power control circuit coupled to said thermoelectric cooler elements for feeding a predetermined power to said cooler elements;

a heater controller for applying power to the heater means in the amount, which corresponds to the temperature difference between said thermal load and said reference temperature housing detected by said detector, so as to maintain said thermal load and said housing at substantially the same temperature; and means for measuring said power fed to said heating means.

2. A microcalorimeter as claimed in claim 1, wherein said heater means includes a manganin wire wound around the outer periphery of said elongated portion of said thermal load, said winding being applied with a thermally conductive adhesive so as to be thermally integrated with said thermal load.

3. A microcalorimeter as claimed in claim 2, wherein the winding density of said winding is changed in the axial direction of said elongated portion so as to equalize the thermal effect of said heating means, on said thermal load, with that of said absorber.

4. A microcalorimeter as claimed in claims 2 or 3, wherein said winding is divided into two or more separate windings.

5. A microcalorimeter as claimed in claim 1, wherein the inside space of said reference temperature housing is maintained in vacuum.

6. A microcalorimeter as claimed in claim 1, wherein the inside space of said reference temperature housing is packed with a thermal insulating substance.

7. A microcalorimeter as claimed in claim 1, 5 or 6, further comprising an outer jacket surrounding said reference temperature housing to define a second space therebetween.

8. A microcalorimeter as claimed in claim 7, wherein said second space is maintained in vacuum.

9. A microcalorimeter as claimed in claim 7, wherein said second space is packed with a thermal insulating substance.

10. A microcalorimeter as claimed in claim 1, wherein said hollow elongated portion of said thermal load has an interior surface layer uniformly formed by electroforming.

11. A microcalorimeter as claimed in claim 1, wherein said extending portion of said waveguide member is formed of a metal of a low thermal conductor and said thermal load is formed of a metal of good thermal conductor, said extending portion and said elongated portion of said thermal load having a unitary interior surface layer uniformly formed by electroforming.

12. A microcalorimeter as claimed in claim 1, wherein said thermoelectric cooling element is composed of one or more pairs of first pelitier elements and said thermoelectric sensor element is composed of the same number of pairs of second pelitier elements as said cooling element, said first and second pelitier elements being alternately arranged in a circle and angularly equally spaced with each other, and each pair of respective first and second pelitier elements being positioned symmetrically with respect to the axis of the elongated portion of said thermal load.

13. A microcalorimeter as claimed in claim 1, wherein said cooling-power control circuit includes a digital current setting circuit for effecting adaptive control to supply an optimum power to said cooler element.

14. A microcalorimeter as claimed in claim 1, wherein said heater controller includes a digital heating current setting circuit for effecting adaptive control.

15. A microcalorimeter as claimed in claim 1, wherein said cooling-power control circuit includes a digital current setting circuit for effecting adaptive control and an analogue negative feedback control circuit.

16. A microcalorimeter as claimed in claim 1, wherein said heater controller includes a digital current setting circuit combined with an analogue negative feedback current measuring circuit.

17. A microcalorimeter as claimed in claim 1, wherein said wave absorber is formed of a dielectric member of a good thermal conductor and wherein said heating means includes a plurality of separate layers of an electrical resistance thin film formed by evaporation on the surface of said wave absorber, said wave absorber being attached to the inner wall of said elongated portion of said thermal load in heat contact therewith.

18. A microcalorimeter as claimed in claim 1, wherein said heater means includes a plurality of separate windings of an electrical resistance wire embedded in the center region of said power absorber.

19. A microcalorimeter as claimed in claim 1, wherein said heater means includes a plurality of separate resistance elements spaced with each other and embedded in the center region of said power absorber.

20. A microcalorimeter as claimed in claim 1, wherein said heater means includes a plurality of separate electrical resistance wires each bent into a comb-like form and integrally molded in the center region of said power absorber.

* * * * *

UNITED STATES PATENT AND TRADEMARK OFFICE
CERTIFICATE OF CORRECTION

PATENT NO. : 4,223,264
DATED : September 16, 1980
INVENTOR(S) : Yamamura et al.

It is certified that error appears in the above-identified patent and that said Letters Patent are hereby corrected as shown below:

```
In the Abstract ([57]), line 6, after "load for" insert
      --cooling--.
Column 2, line 40, after "exists" insert --the--.
Column 3, line 47, "other" should be --another--.
Column 4, line 16, "are" should be --is--;
          line 32, "15 mV" should be --15mW--;
          line 33, "tha" should be --than--;
          line 40, "in" should be --is--.
Column 6, line 14, "be" should be --by--.
Column 9, line 24, "the amount" should be --an amount--.
```

Signed and Sealed this

Seventh Day of April 1981

[SEAL]

Attest:

RENE D. TEGTMEYER

Attesting Officer        Acting Commissioner of Patents and Trademarks